(12) United States Patent
Kim et al.

(10) Patent No.: US 10,707,181 B2
(45) Date of Patent: Jul. 7, 2020

(54) SEMICONDUCTOR DEVICE WITH REDISTRIBUTION LAYERS FORMED UTILIZING DUMMY SUBSTRATES

(71) Applicant: Amkor Technology, Inc., Tempe, AZ (US)

(72) Inventors: Jin Young Kim, Seoul (KR); Ji Young Chung, Gyeonggi-do (KR); Doo Hyun Park, Gyeonggi-do (KR); Choon Heung Lee, Seoul (KR)

(73) Assignee: AMKOR TECHNOLOGY INC., Tempe, AZ (US)

( * ) Notice: Subject to any disclaimer, the term of this patent is extended or adjusted under 35 U.S.C. 154(b) by 0 days.

(21) Appl. No.: 14/449,654

(22) Filed: Aug. 1, 2014

(65) Prior Publication Data
US 2015/0221601 A1 Aug. 6, 2015

(30) Foreign Application Priority Data

Feb. 5, 2014 (KR) .......................... 10-2014-0013332

(51) Int. Cl.
*H01L 23/00* (2006.01)
*H01L 21/56* (2006.01)
(Continued)

(52) U.S. Cl.
CPC ............ *H01L 24/02* (2013.01); *H01L 21/563* (2013.01); *H01L 21/568* (2013.01);
(Continued)

(58) Field of Classification Search
CPC . H01L 2224/083191–083199; H01L 2224/23; H01L 25/117;
(Continued)

(56) References Cited

U.S. PATENT DOCUMENTS

2003/0017647 A1* 1/2003 Kwon .................. H01L 21/568
438/109
2005/0184399 A1* 8/2005 Damberg .......... H01L 23/49816
257/777
(Continued)

*Primary Examiner* — Matthew L Reames
*Assistant Examiner* — John A Bodnar
(74) *Attorney, Agent, or Firm* — McAndrews, Held & Malloy, Ltd.

(57) ABSTRACT

A semiconductor device with redistribution layers formed utilizing dummy substrates is disclosed and may include forming a first redistribution layer on a first dummy substrate, forming a second redistribution layer on a second dummy substrate, electrically connecting a semiconductor die to the first redistribution layer, electrically connecting the first redistribution layer to the second redistribution layer, and removing the dummy substrates. The first redistribution layer may be electrically connected to the second redistribution layer utilizing a conductive pillar. An encapsulant material may be formed between the first and second redistribution layers. Side portions of one of the first and second redistribution layers may be covered with encapsulant. A surface of the semiconductor die may be in contact with the second redistribution layer. The dummy substrates may be in panel form. One of the dummy substrates may be in panel form and the other in unit form.

16 Claims, 19 Drawing Sheets

1A)

1B)

(51) Int. Cl.
    *H01L 23/31*    (2006.01)
    *H01L 23/538*   (2006.01)
    *H01L 25/10*    (2006.01)
    *H01L 21/683*   (2006.01)
    *H01L 21/48*    (2006.01)

(52) U.S. Cl.
    CPC ...... *H01L 21/6835* (2013.01); *H01L 23/3142* (2013.01); *H01L 23/5385* (2013.01); *H01L 23/5389* (2013.01); *H01L 25/105* (2013.01); H01L 21/4857 (2013.01); H01L 23/3128 (2013.01); H01L 23/5387 (2013.01); H01L 24/16 (2013.01); H01L 24/32 (2013.01); H01L 24/73 (2013.01); H01L 24/81 (2013.01); H01L 2221/68345 (2013.01); H01L 2221/68372 (2013.01); H01L 2224/023 (2013.01); H01L 2224/02319 (2013.01); H01L 2224/02371 (2013.01); H01L 2224/02373 (2013.01); H01L 2224/0401 (2013.01); H01L 2224/1316 (2013.01); H01L 2224/13124 (2013.01); H01L 2224/13147 (2013.01); H01L 2224/16225 (2013.01); H01L 2224/32225 (2013.01); H01L 2224/73204 (2013.01); H01L 2224/81001 (2013.01); H01L 2224/81192 (2013.01); H01L 2224/92125 (2013.01); H01L 2225/1035 (2013.01); H01L 2225/1058 (2013.01); H01L 2924/15311 (2013.01); H01L 2924/181 (2013.01)

(58) Field of Classification Search
    CPC . H01L 2924/1815–18162; H01L 2224/32145; H01L 2225/1058
    See application file for complete search history.

(56) References Cited

U.S. PATENT DOCUMENTS

| | | | |
|---|---|---|---|
| 2006/0141764 A1* | 6/2006 | Oi | H01L 23/49822 438/622 |
| 2007/0018313 A1* | 1/2007 | Gomyo | H01L 21/568 257/723 |
| 2007/0040281 A1* | 2/2007 | Nakayama | B81B 7/0041 257/778 |
| 2007/0290310 A1* | 12/2007 | Kusano | H01L 21/565 257/684 |
| 2008/0036058 A1* | 2/2008 | Cheng | H01L 23/49816 257/678 |
| 2009/0140415 A1* | 6/2009 | Furuta | 257/700 |
| 2009/0284947 A1* | 11/2009 | Beddingfield | H01L 23/49833 361/818 |
| 2010/0120199 A1* | 5/2010 | Lim | H01L 21/561 438/109 |
| 2010/0123251 A1* | 5/2010 | Chow | H01L 24/14 257/773 |
| 2010/0140779 A1* | 6/2010 | Lin | H01L 23/49816 257/690 |
| 2010/0295091 A1* | 11/2010 | Strzegowski | C08L 23/0869 257/100 |
| 2011/0049695 A1* | 3/2011 | Shin | H01L 21/561 257/686 |
| 2011/0115081 A1* | 5/2011 | Osumi | H01L 23/49811 257/737 |
| 2012/0012985 A1* | 1/2012 | Shen | H01L 23/3171 257/618 |
| 2012/0077312 A1* | 3/2012 | Lee | H01L 21/563 438/108 |
| 2012/0080787 A1* | 4/2012 | Shah | H01L 21/4853 257/737 |
| 2012/0139068 A1* | 6/2012 | Stacey | B81C 1/0023 257/417 |
| 2013/0270682 A1* | 10/2013 | Hu | H01L 23/5389 257/666 |
| 2014/0061888 A1* | 3/2014 | Lin | H01L 23/3128 257/690 |
| 2014/0124949 A1* | 5/2014 | Paek | H01L 25/105 257/774 |
| 2015/0069623 A1* | 3/2015 | Tsai | H01L 21/563 257/774 |
| 2016/0056087 A1* | 2/2016 | Wu | H01L 23/49816 257/738 |

* cited by examiner

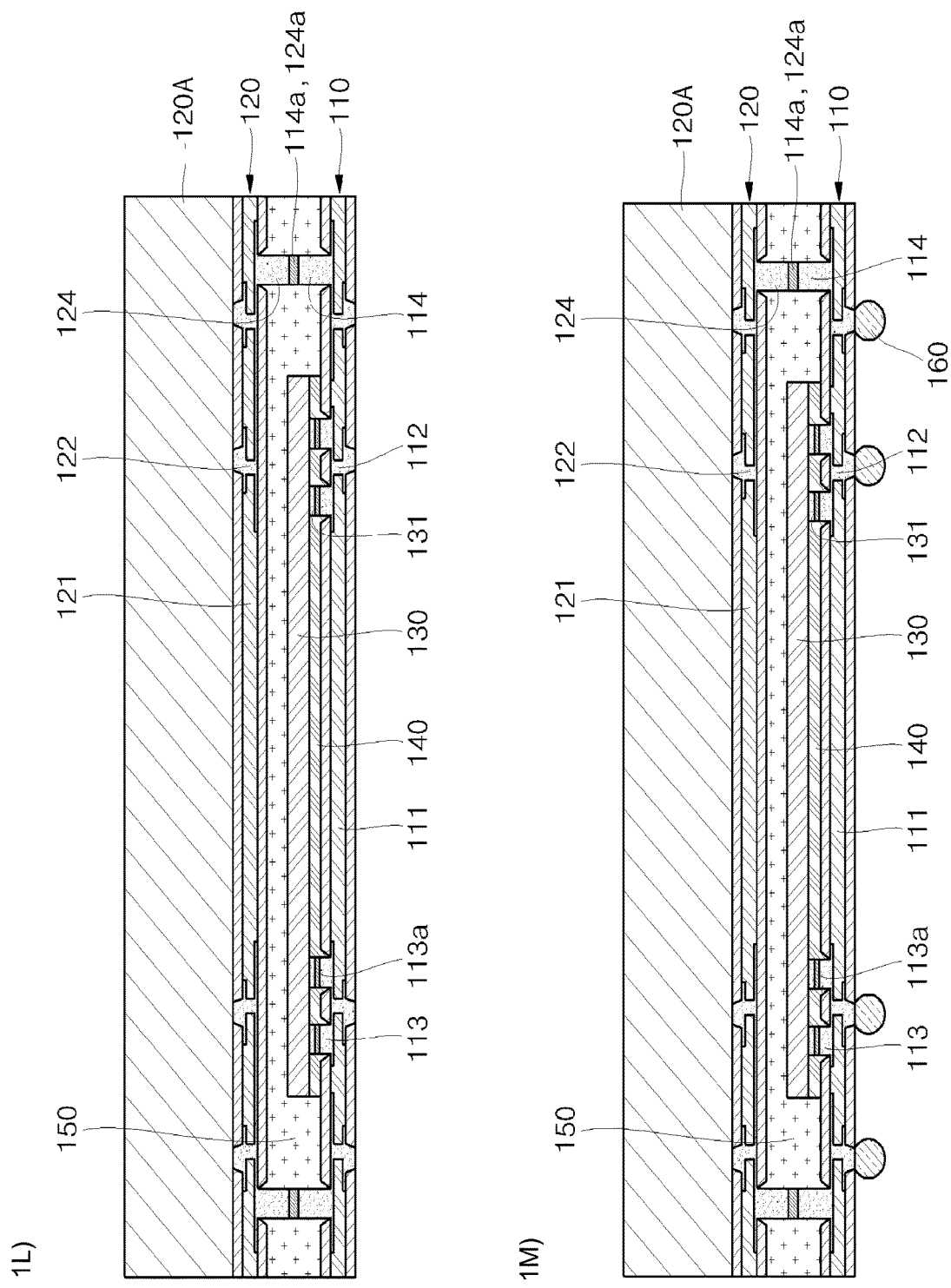

SEMICONDUCTOR DEVICE WITH REDISTRIBUTION LAYERS FORMED UTILIZING DUMMY SUBSTRATES

CROSS-REFERENCE TO RELATED APPLICATIONS

The present application makes reference to, claims priority to, and claims the benefit of Korean Patent Application No. 10-2014-0013332, filed on Feb. 5, 2014, the contents of which are hereby incorporated herein by reference, in their entirety.

FIELD

Certain embodiments of the disclosure relate to semiconductor chip packaging. More specifically, certain embodiments of the disclosure relate to a semiconductor device with redistribution layers formed utilizing dummy substrates.

BACKGROUND

In general, a semiconductor package includes a semiconductor die, a plurality of leads electrically connected to the semiconductor die and an encapsulant encapsulating the semiconductor die and the leads. In general, a POP (Package On Package) refers to a technique for vertically stacking packages incorporating at least one semiconductor die. Since the packages are individually tested and only tested packages may be stacked, the POP is advantageous in view of assembling yield.

However, in the conventional POP, since a relatively thick printed circuit board (PCB) is typically used as a substrate and a solder ball having a relatively large diameter is used as an internal conductor, the overall thickness of the POP is approximately 1 mm or greater. In addition, a circuit pattern formed on the substrate has a width of approximately 10 μm or greater.

The PCB includes a variety of organic materials, and the coefficient of the thermal expansion of the organic material may be significantly different from that of an inorganic material, such as the semiconductor die or an encapsulant, and as such a considerably severe warping phenomenon may occur to the completed POP.

Additionally, in order to fabricate a POP, the costly PCB must be purchased, increasing the manufacturing cost of the POP.

Further limitations and disadvantages of conventional and traditional approaches will become apparent to one of skill in the art, through comparison of such systems with the present disclosure as set forth in the remainder of the present application with reference to the drawings.

BRIEF SUMMARY

A semiconductor device with redistribution layers formed utilizing dummy substrates, substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Figures 1A, 1B:
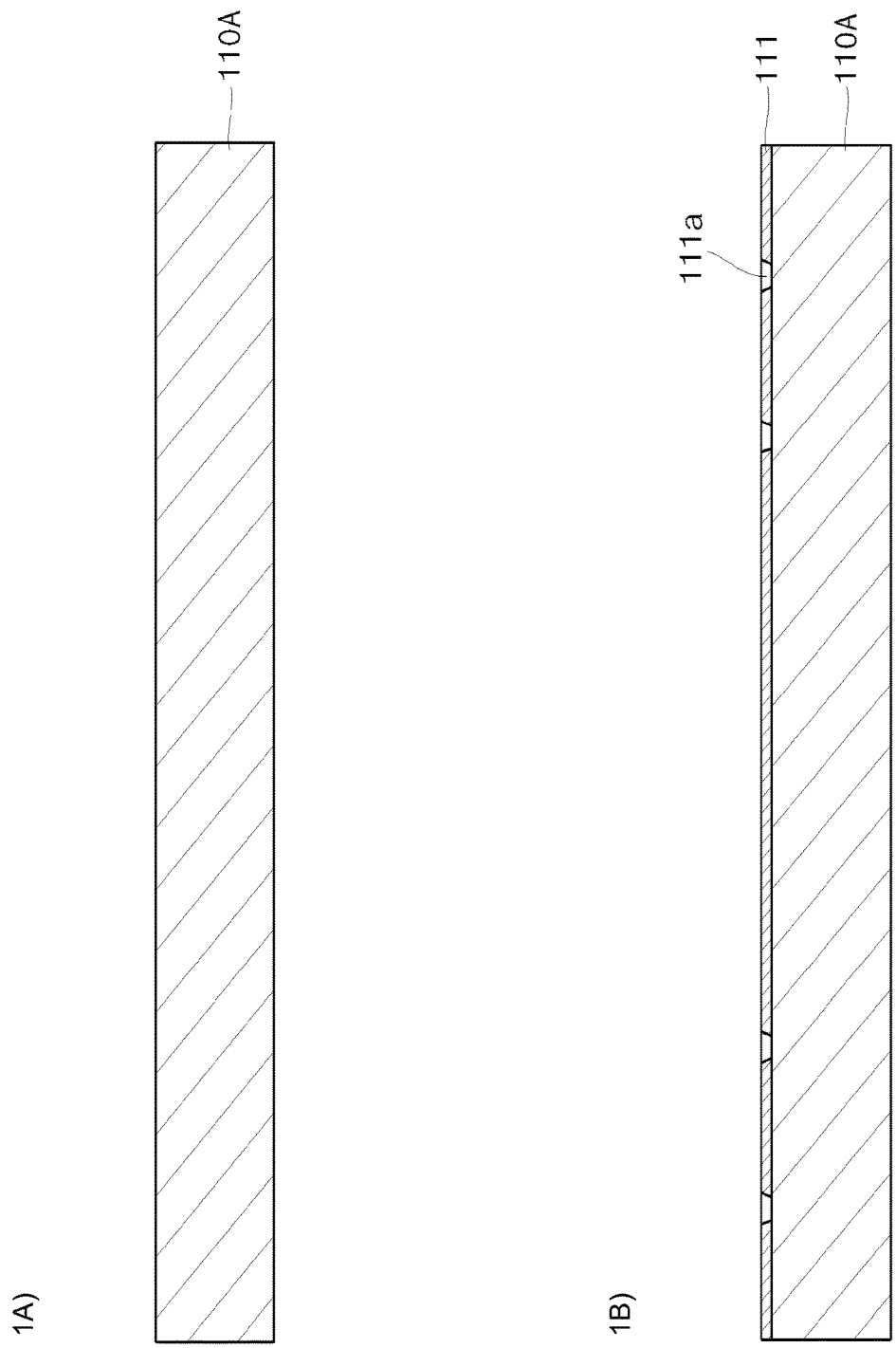
FIGS. 1A-1N are cross-sectional views illustrating a manufacturing method of a semiconductor device, in accordance with an example embodiment of the present disclosure.

Certain aspects of the disclosure may be found in a semiconductor device with redistribution layers formed utilizing dummy substrates. Example aspects of the disclosure may comprise forming a first redistribution layer on a first dummy substrate, forming a second redistribution layer on a second dummy substrate, electrically connecting a semiconductor die to the first redistribution layer, electrically connecting the first redistribution layer to the second redistribution layer, and removing the first and second dummy substrates. The first redistribution layer may be electrically connected to the second redistribution layer utilizing a conductive pillar. An encapsulant material may be formed between the first redistribution layer and the second redistribution layer. Side portions of one of the first and second redistribution layers may be covered with encapsulant. A surface of the semiconductor die may be in contact with the second redistribution layer. The first and second dummy substrates may be in panel form, or one of the first and second dummy substrates may be in panel form and the other may be in unit form. A third redistribution layer may be bonded to one of the first and second redistribution layers after removing the first and second dummy substrates. An encapsulant material may be formed near side edges of the first and second redistribution layers but not in contact with the semiconductor die. A back surface of the first and second redistribution layers may be exposed by removing the first and second dummy substrates. A solder ball may be formed on an exposed back surface of the first and second redistribution layers. The first and second dummy substrates may be removed utilizing grinding and/or etching processes. The semiconductor die may be flip-chip bonded to the first redistribution layer.

Various aspects of the present disclosure may be embodied in many different forms and should not be construed as being limited to the example embodiments set forth herein. Rather, these example embodiments of the disclosure are provided so that this disclosure will be thorough and complete and will fully convey various aspects of the disclosure to those skilled in the art.

In the drawings, the thickness of layers and regions are exaggerated for clarity. Here, like reference numerals refer to like elements throughout. As used herein, the term "and/or" includes any and all combinations of one or more of the associated listed items.

In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprises" and/or "comprising," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

As illustrated in FIG. 1A, a first dummy substrate 110A having a substantially planar top surface and a substantially planar bottom surface is prepared. The first dummy substrate 110A may include, for example, silicon, low-grade silicon, glass, silicon carbide, sapphire, quartz, ceramic, metal oxide, a metal, or equivalents thereof, but aspects of the present disclosure are not limited thereto.

A method for forming the first redistribution layer 110 on the first dummy substrate 110A will now be described. The method of forming the first redistribution layer 110 is substantially the same as a method of forming the second redistribution layer 120 on the second dummy substrate 120A.

As illustrated in FIG. 1B, first, a first dielectric layer 111 may be deposited on the first dummy substrate 110A by chemical vapor deposition (CVD), and first openings 111a may be formed by a photolithography process and/or a laser process. A top surface of the first dummy substrate 110A may be directly exposed to the outside by the first openings 111a.

Here, the first dielectric layer 111 may include silicon oxide, silicon nitride and/or equivalents thereof, but aspects of the present disclosure are not limited thereto.

Figures 1C, 1D:
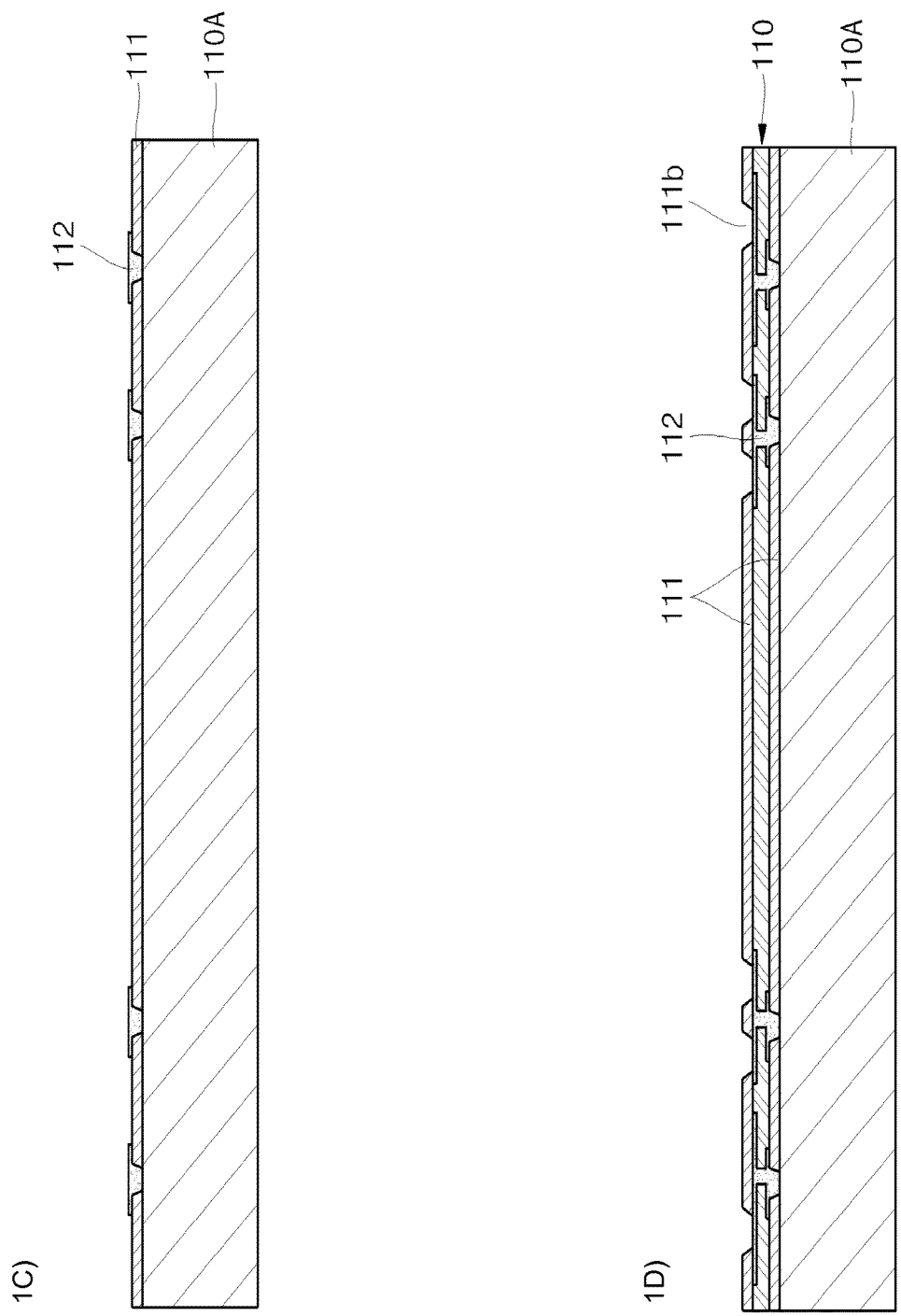

As illustrated in FIG. 1C, first redistributions 112 may be formed in the first openings 111a and the first dielectric layer 111. Accordingly, the first redistributions 112 may make direct contact with the first dummy substrate 110A through the first openings 111a. The first redistributions 112 may be formed by an electroless plating process for a seed layer based on gold, silver, nickel, titanium and/or tungsten, an electroplating process using copper, or a photolithography process using photoresist, but aspects of the present disclosure are not limited thereto.

In addition, the first redistributions 112 may include, for example, not only copper but also a copper alloy, aluminum, an aluminum alloy, iron, an iron alloy or equivalents thereof, but aspects of the present disclosure are not limited thereto.

As illustrated in FIG. 1D, the process of forming the first dielectric layer 111 and the process of forming the first redistributions 112 may be repeated multiple times, thereby completing the first redistribution layer 110 having a multi-layered structure. For example, the first redistribution layer 110 includes a dielectric layer and redistributions. However, unlike in a conventional printed circuit board (PCB) (e.g., a rigid PCB or a flexible PCB), an organic core layer or an organic build-up layer might not be utilized in the first redistribution layer 110. Therefore, the first redistribution layer 110 may be relatively thin. For example, the first redistribution layer 110 may be formed to a thickness of 10 μm or less. By contrast, a conventional PCB may generally be formed to a thickness in the range of 200 μm to 300 μm.

As described above, since the first redistribution layer 110 may be formed by a fabrication (FAB) process, the first redistributions 112 may be formed with a width, thickness and/or pitch in a range of 20 nm to 1000 nm. Therefore, the present disclosure may provide considerably fine first redistributions 112, thereby accommodating highly integrated semiconductor dies. By contrast, redistributions of conventional PCBs have been generally formed with a width, thickness and/or pitch in a range of 20 μm to 30 μm.

Here, openings 111b may be formed on the first dielectric layer 111 on the topmost portion of the first redistribution layer 110, and some regions of the first redistributions 112 may be directly exposed to the outside. A first conductive pad 113 and a conductive pillar 114 to later be described may be formed on the directly exposed first redistributions 112.

Figures 1E, 1F:
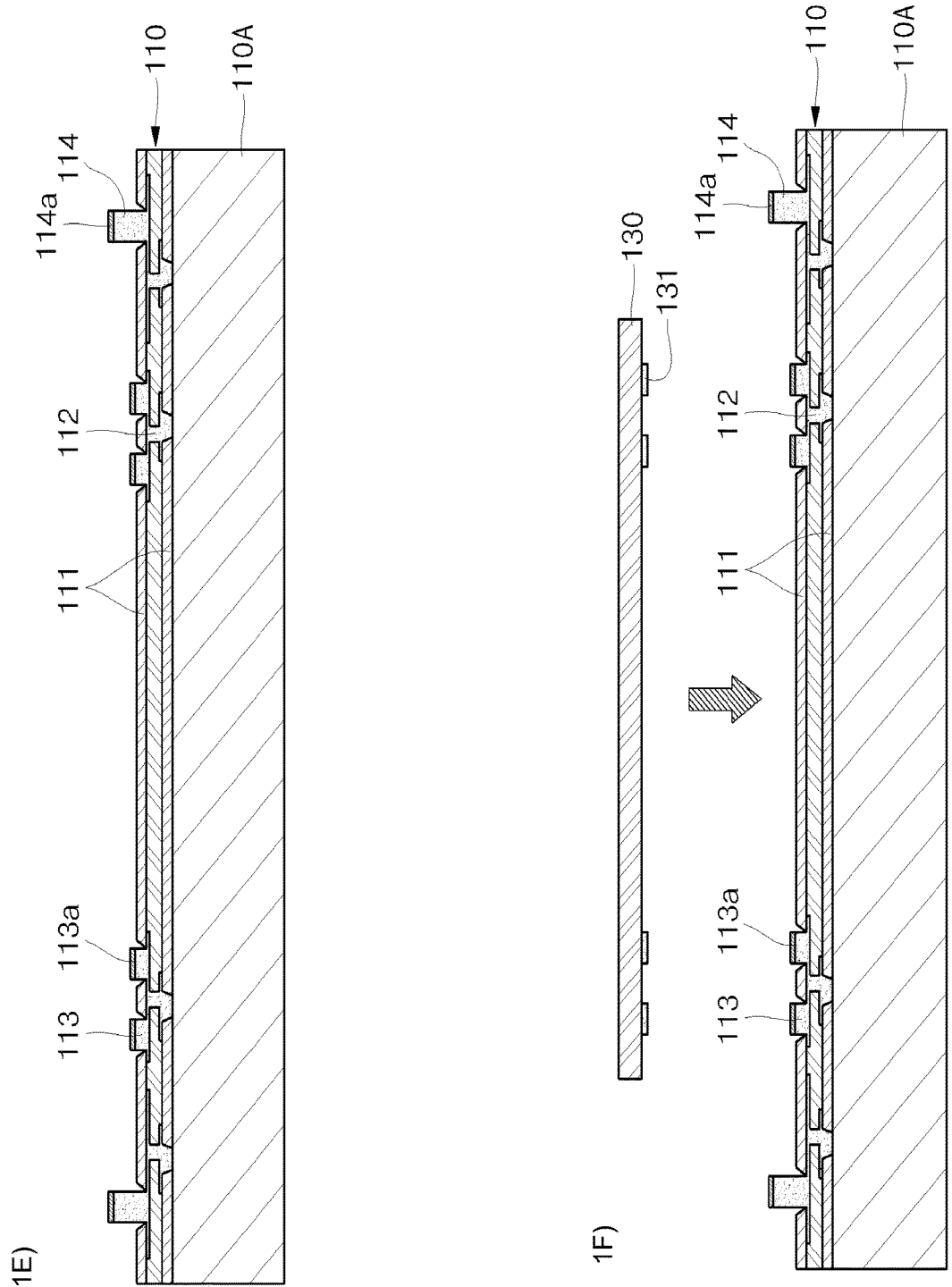

As illustrated in FIG. 1E, the first conductive pad 113 may be formed in the first redistribution 112 to allow a semiconductor die 130 to later be described to be electrically connected thereto. In addition, a first conductive pillar 114 may be formed in the second redistribution layer 120 to be electrically connected thereto. Here, the first conductive pad 113 and the first conductive pillar 114 may include, for example, copper, a copper alloy, aluminum, an aluminum alloy, iron, an iron alloy or equivalents thereof, but aspects of the present disclosure are not limited thereto.

In addition, since the first conductive pad 113 and the first conductive pillar 114 may also be formed by a general plating process or photolithography process, they may be formed with a width of approximately 50 μm. Therefore, the first conductive pad 113 and the first conductive pillar 114 may be formed to be considerably fine, compared to the conventional art. For example, the conventional solder ball formed on the first redistribution layer may be formed to have a diameter of approximately 200 μm or greater.

Meanwhile, a first solder cap 113a may be additionally formed at a top end of the first conductive pad 113 to allow the semiconductor die 130 to be easily connected. In addition, another solder cap 114a may be additionally formed at a top end of the first conductive pillar 114 to allow the second redistribution layer 120 to be easily connected.

In addition, since the first conductive pillar 114 may be electrically connected to the second redistribution layer 120 that is relatively far from the first conductive pillar 114, it may be formed to a height greater than that of the first conductive pad 113.

Figures 1G, 1H:
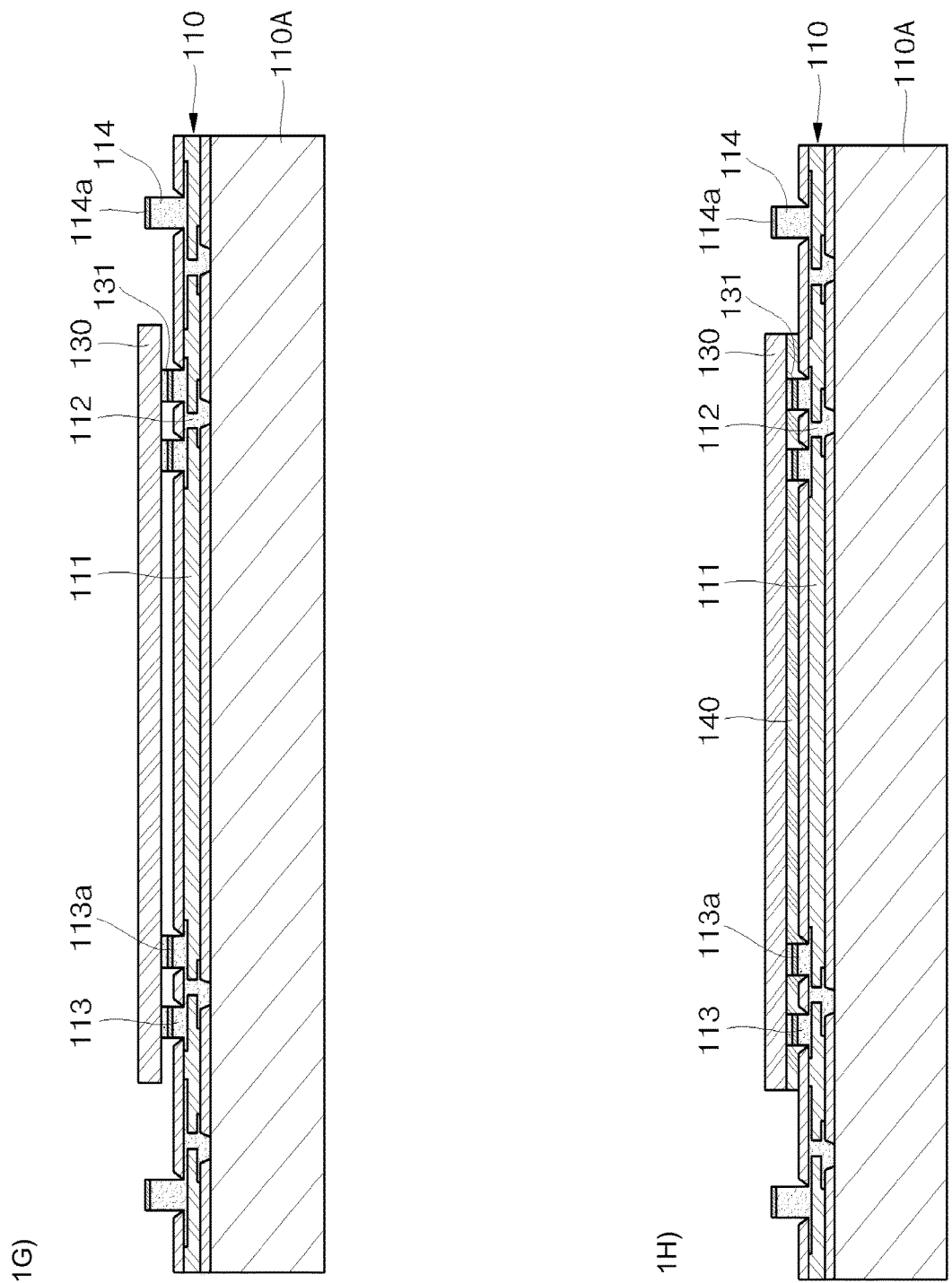

As illustrated in FIGS. 1F and 1G, the semiconductor die 130 may be electrically connected to the first redistribution layer 110. For example, a bonding pad, a copper pillar or a bump 131 of the semiconductor die 130 may be electrically connected to the first redistribution layer 110. In addition, the semiconductor die 130 may be connected to the first redistribution layer 110 in a flip-chip type.

The connection of the semiconductor die 130 may be achieved by, for example, one of a general thermal compression process, a mass reflow process or equivalents thereof, but aspects of the present disclosure are not limited thereto. Here, the semiconductor die 130 may have a thickness in a range of approximately 50 µm to approximately 70 µm, but aspects of the present disclosure are not limited thereto.

Here, a height of the first conductive pillar 114 may be greater or smaller than that of the semiconductor die 130.

As illustrated in FIG. 1H, an underfill 140 may be injected into a space between the semiconductor die 130 and the first redistribution layer 110, followed by curing.

The semiconductor die 130 may be more stably fixed on the first redistribution layer 110 by the underfill 140. Even if there is a difference in the coefficient of thermal expansion between the semiconductor die 130 and the first redistribution layer, the semiconductor die 130 and the first redistribution layer 110 are not electrically disconnected from each other.

In some cases, if a dimension of an encapsulant 150 (described below) is smaller than a gap between the semiconductor die 130 and the first redistribution layer 110, the encapsulant 150 may directly fill the gap between the semiconductor die 130 and the first redistribution layer 110. Accordingly, the underfill 140 might not be provided.

Figure 1I:
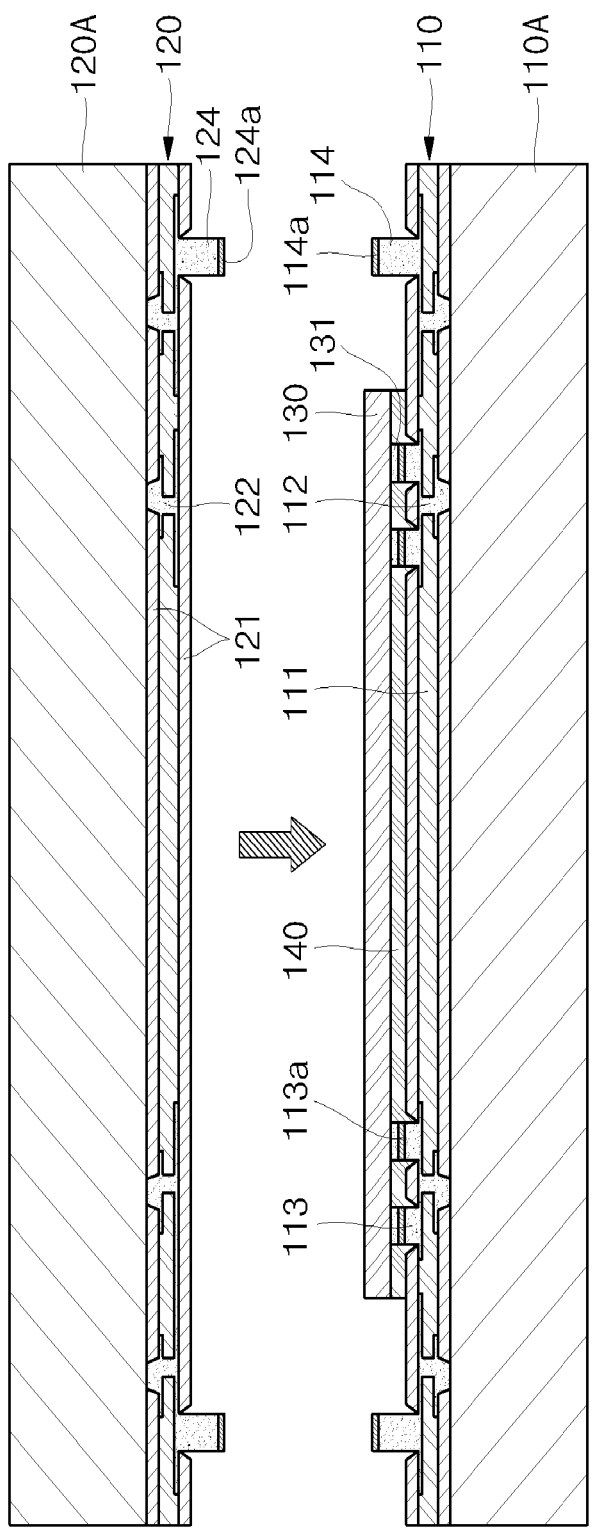
Figure 1J:
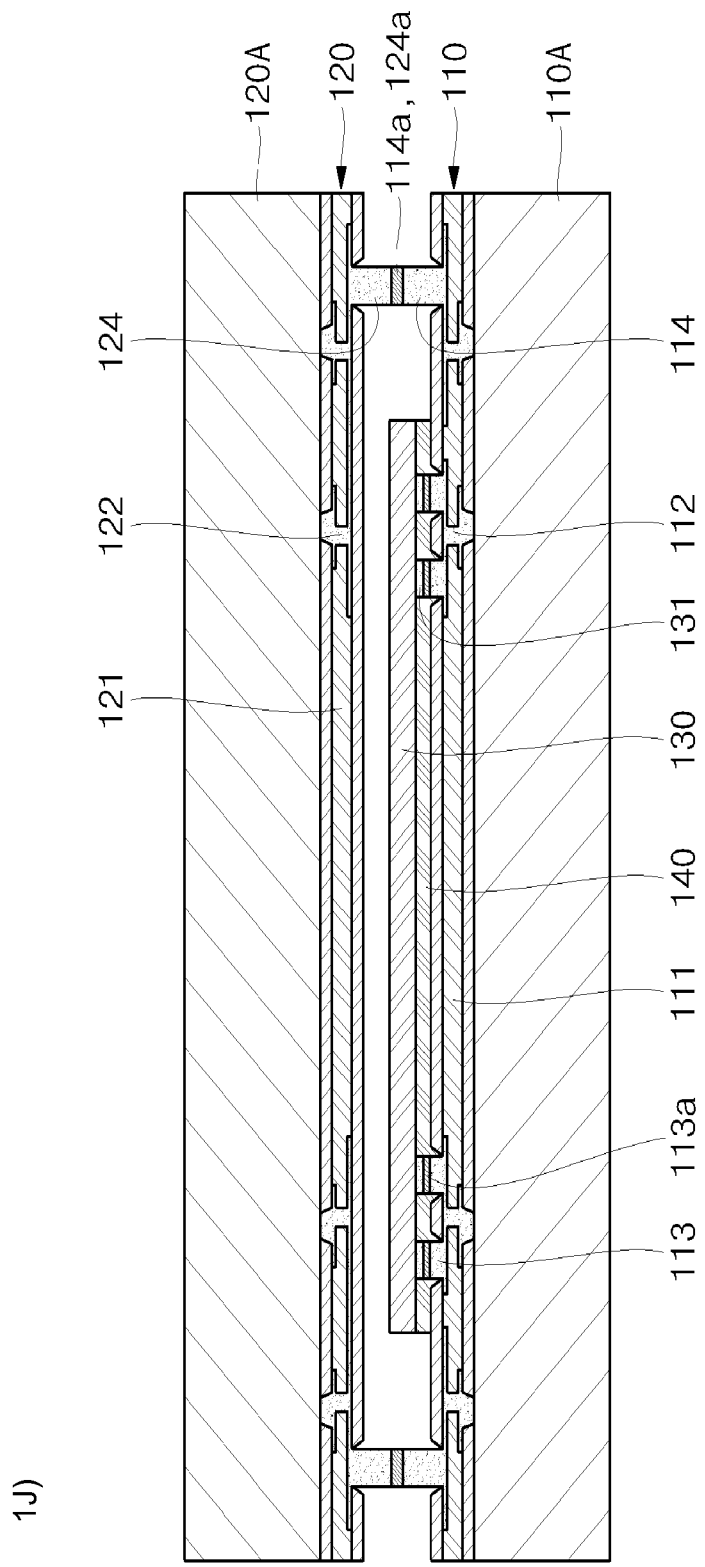

As illustrated in FIGS. 1I and 1J, the second redistribution layer 120 may be formed on the second dummy substrate 120A and the second redistribution layer 120 may be electrically connected to the first redistribution layer 110.

Here, the method for forming the second redistribution layer 120 may be the same as the method for forming the first redistribution layer 110. In an example embodiment, the method for forming the second redistribution layer 120 includes forming a second dielectric layer 121 having second openings on the second dummy substrate 120A, forming a plurality of second redistributions 122 on the second dielectric layer 121, and forming a second conductive pillar 124 to electrically connect the first redistribution layer 110 to the second redistributions 122. Here, a second solder cap 124a may be formed at a bottom end of the second conductive pillar 124. In addition, if the semiconductor die is electrically connected to the second redistribution layer 120, a second conductive pad (not shown) may also be formed.

Electrical connection of the first redistribution layer 110 and the second redistribution layer 120, that is, electrical connection of the first conductive pillar 114 and the second conductive pillar 124 may be achieved by, for example, one of a general thermal compression process, a mass reflow process or equivalents thereof, but aspects of the present disclosure are not limited thereto.

Figure 1K:
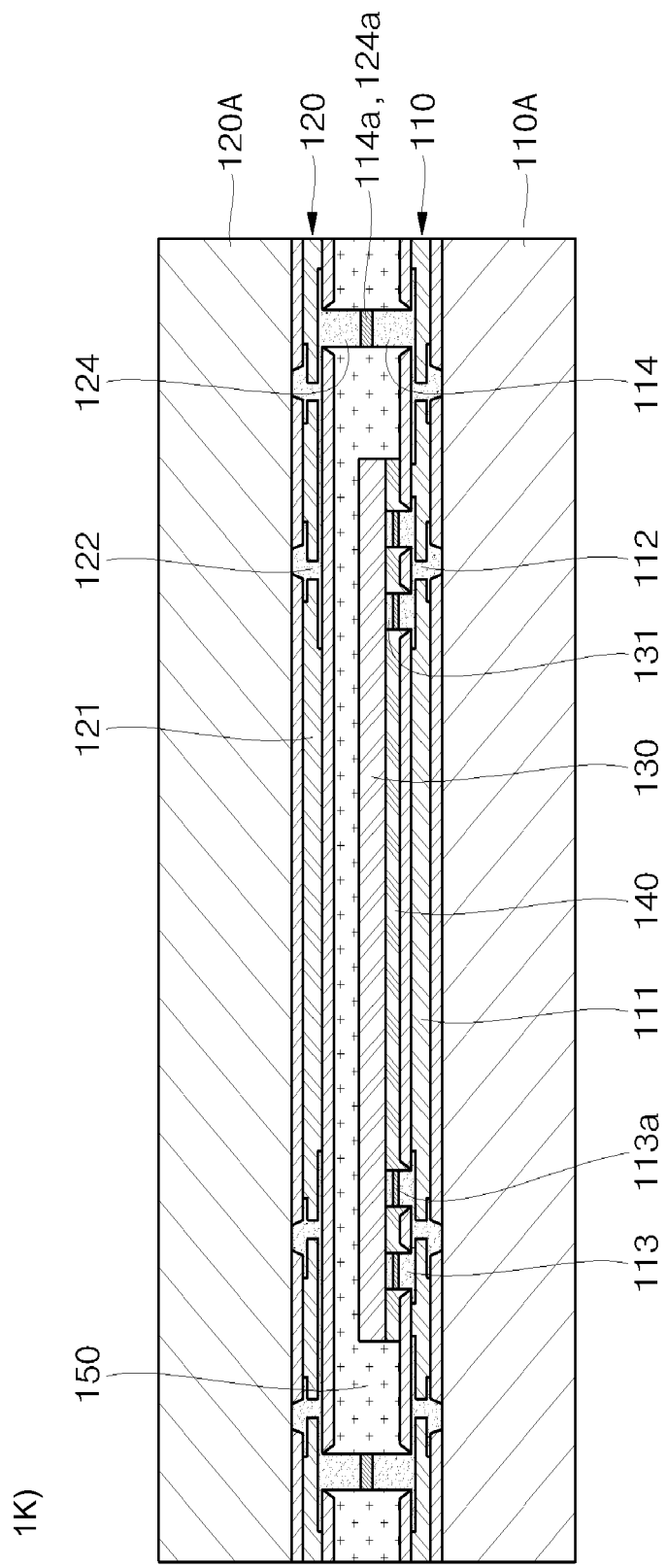

As illustrated in FIG. 1K, the encapsulant 150 may be injected between the first redistribution layer 110 and the second redistribution layer 120, followed by curing, thereby encapsulating the semiconductor die 130 and the first and second conductive pillars 114 and 124. Therefore, the semiconductor die 130 and the first and second conductive pillars 114 and 124 may be safely protected from external surroundings. The encapsulant 150 may make close contact with the first redistribution layer 110 and the second redistribution layer 120 and may be injected into a space between the semiconductor die 130 and the second redistribution layer 120. Here, a top surface of the semiconductor die 130 may be spaced a predetermined distance apart from a bottom surface of the second redistribution layer 120.

After the first redistribution layer 110 and the second redistribution layer 120 are electrically connected, the encapsulation may be achieved by a transfer molding process, a compression molding process, an injection molding process and equivalents thereof, but aspects of the present disclosure are not limited thereto.

In addition, the encapsulant 150 may generally include, for example, epoxy, a film, a paste and equivalents thereof, but aspects of the present disclosure are not limited thereto.

Further, the encapsulant 150 may be in the form of a film or a paste to then be attached, coated or applied to the first redistribution layer 110 and the second redistribution layer 120, followed by electrically connecting the first redistribution layer 110 and the second redistribution layer 120. During this process, the encapsulant 150 of the first redistribution layer 110 and the encapsulant 150 of the second redistribution layer 120 may be bonded to each other to make one encapsulant 150.

In such a manner, the first and second redistribution layers 110 and 120, the semiconductor die 130 and the first and second conductive pillars 114 and 124 might not be separated from each other but may be mechanically integrated by the encapsulant 150.

In addition, a flexible epoxy resin may be used as the encapsulant 150, for example. The flexible epoxy resin may retain flexibility even after curing, thereby achieving a flexible semiconductor device. For example, even if the flexible semiconductor device is bent with a predetermined curvature, it might not be damaged by the encapsulant 150, that is, the flexible epoxy resin, and might not experience functional deterioration.

The flexible semiconductor device may be applied to wearable devices of a variety of types, for example, a glass mounting type, a bracelet type, an arm band type, a pendent type, a wrist mounting type, or the like.

As illustrated in FIG. 1L, the first dummy substrate 110A may be removed from the first redistribution layer 110. In detail, the first dummy substrate 110A may be removed by grinding using the second dummy substrate 120A as a wafer support system, followed by performing a dry etching process and/or a wet etching process, thereby completely removing the first dummy substrate 110A.

In such a manner, some regions of the first redistributions 112 of the first redistribution layer 110 may be exposed to the outside (e.g., a lower portion) through the first dielectric layer 111. In more detail, a seed layer (gold, silver, nickel, titanium, and/or tungsten) may be directly exposed to the outside through the first dielectric layer 111. Gold and/or silver may be directly exposed to the outside through the first dielectric layer 111 to facilitate a connection with a solder ball or another semiconductor device in a subsequent process.

As illustrated in FIG. 1M, a solder ball 160 may be connected to the first redistribution 112 exposed to the outside through the first dielectric layer 111. For example, a volatile flux may be coated on a predetermined region of the first redistribution 112 exposed to the outside through the first dielectric layer 111, and the solder ball 160 may be positioned on the flux, following by the supply of a temperature of approximately 150° C. to approximately 250° C. to make the flux volatilize to connect the solder ball 160 to be connected to a region of the first redistribution 112. Thereafter, the solder ball 160 may be completely mechanically/electrically connected to the first redistribution 112 through a cooling process.

Figure 1N:
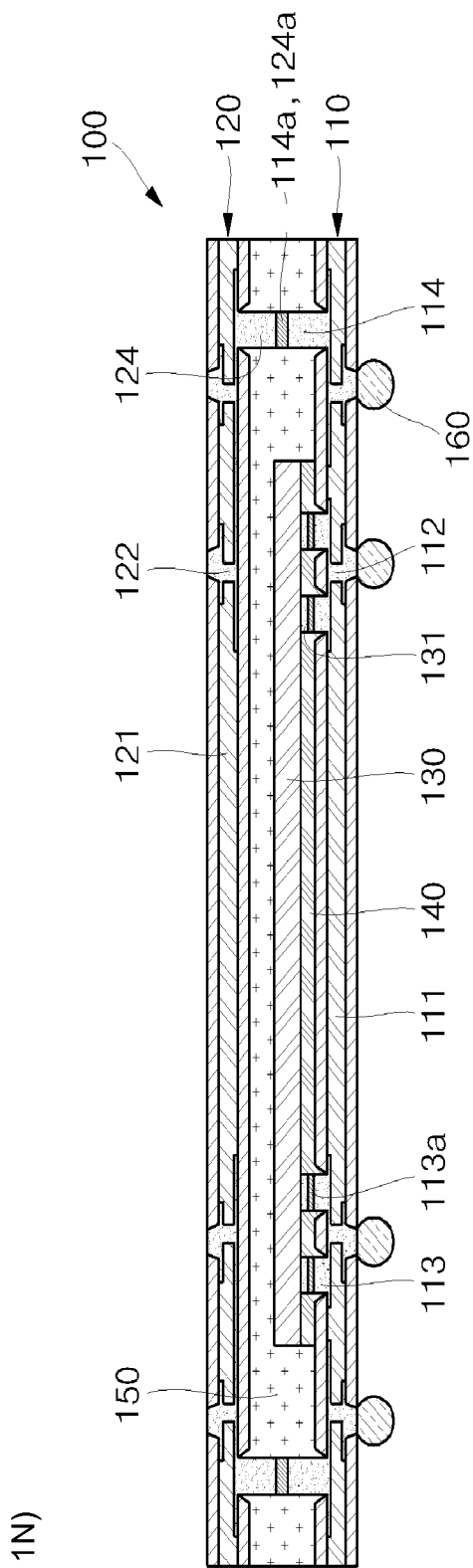

As illustrated in FIG. 1N, the second dummy substrate 120A may be removed from the second redistribution layer 120. In detail, the second dummy substrate 120A may be removed by a predetermined thickness by grinding using a separate wafer support system, followed by performing a dry etching process and/or a wet etching process, thereby completely removing the second dummy substrate 120A.

In such a manner, some regions of the second redistributions 122 and the second redistribution layer 120 may be exposed to the outside (e.g., an upper portion) through the second dielectric layer 121.

Here, a seed layer (gold, silver, nickel, titanium, and/or tungsten) may be directly exposed to the outside through the second dielectric layer 121. Gold and/or silver may be directly exposed to the outside through the second dielectric layer 121 to facilitate a connection with a solder ball or another semiconductor device in a subsequent process.

Meanwhile, in a case where the first dummy substrate 110A and the second dummy substrate 120A are provided in forms of panels, after the removing of the first and second dummy substrates 110A and 120A, a sawing process may be performed. In the sawing process, the first and second redistribution layers 110 and 120 and the encapsulant 150 may be vertically sawn using a sawing tool. As a result of the sawing, side surfaces of the first and second redistribution layers 110 and 120 and the encapsulant 150 may be coplanar. In this case, the horizontal lengths of the first and second redistribution layers 110 and 120 may be equal to each other.

In such a manner, a so-called double-sided electrode package having electrode terminals formed on top and bottoms surfaces is completed. Therefore, another semiconductor device, package or component may be mounted on the completed semiconductor device 100.

Meanwhile, as described above, according to various aspects of the present disclosure, since a PCB is not used, unlike in the conventional art, the semiconductor device 100 that is slim and having good electrical properties and a suppressed warp phenomenon may be provided. For example, the semiconductor device 100 having a thickness of approximately 100 μm to approximately 200 μm by using a redistribution layer having a thickness of approximately 10 μm or less is provided. In addition, the semiconductor device 100 having good electrical properties (with a reduced loss in the power) is provided by using redistributions having a width, thickness and/or pitch in a range of 20 nm to 30 nm. Further, since a dielectric layer included in the redistribution layer may be made of an inorganic material, the semiconductor device 100 having a coefficient of thermal expansion similar to that of the semiconductor die 130 or the encapsulant 150 while suppressing a warp phenomenon, may be provided.

Further, according to various aspects of the present disclosure, since the redistribution layer may be formed using existing deposition equipment, plating equipment or photolithography equipment without purchasing a conventional expensive PCB, the semiconductor device 100 may be manufactured at a low cost.

Figure 2:
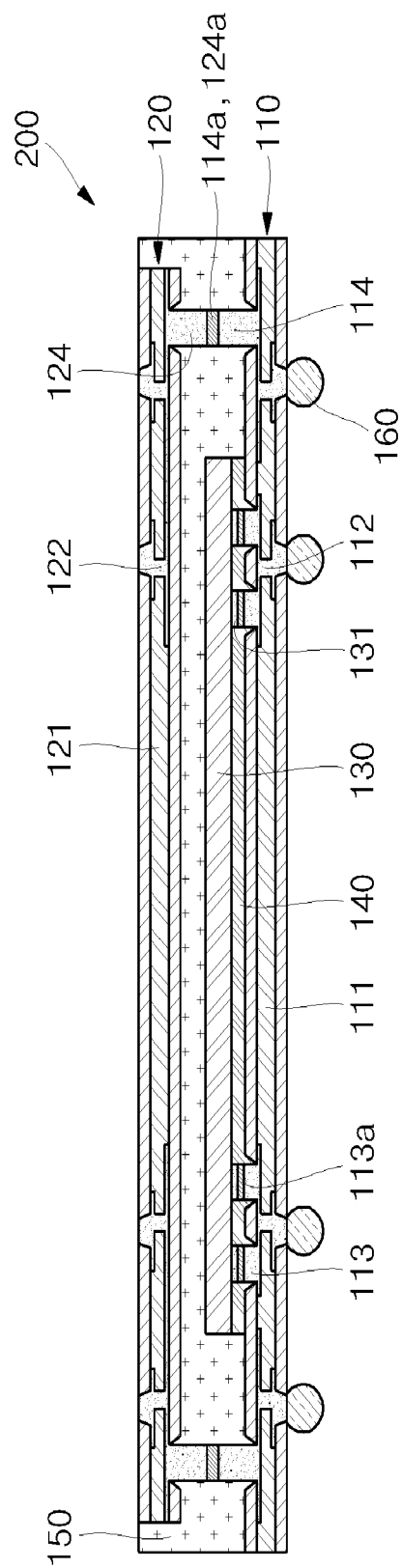
FIG. 2 is a cross-sectional view of a semiconductor device with encapsulant, in accordance with an example embodiment of the disclosure.

FIG. 2 is a cross-sectional view of a semiconductor device with encapsulant, in accordance with an example embodiment of the disclosure.

As illustrated in FIG. 2, in the semiconductor device 200 according to another embodiment of the present disclosure, a horizontal length of the second redistribution layer 120 is smaller than that of the first redistribution layer 110, and side portions of the second redistribution layer 120 may be surrounded by the encapsulant 150. Here, a top surface of the second redistribution layer 120 and a top surface of the encapsulant 150 may be coplanar.

With this configuration, a binding force between the second redistribution layer 120 and the encapsulant 150 may be further increased. The configuration of the semiconductor device 200 may result from a corresponding difference in the manufacturing methods described herein.

Figure 3:
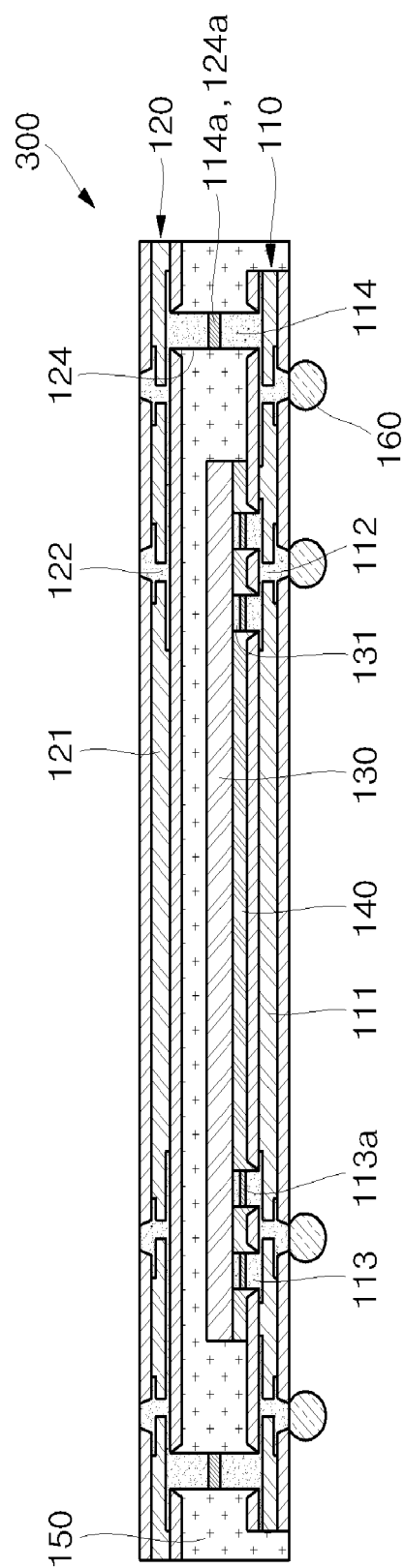
FIG. 3 is a cross-sectional view illustrating a semiconductor device with encapsulant and solder ball contacts, in accordance with an example embodiment of the present disclosure.

FIG. 3 is a cross-sectional view illustrating a semiconductor device with encapsulant and solder ball contacts, in accordance with an example embodiment of the present disclosure.

As illustrated in FIG. 3, in the semiconductor device 300 according to another embodiment of the present disclosure, a length of a first redistribution layer 110 may be smaller than that of a second redistribution layer 120, and side portions of the first redistribution layer 110 may be surrounded by an encapsulant 150. Here, a bottom surface of the second redistribution layer 110 and a bottom surface of the encapsulant 150 may be coplanar.

With this configuration, a binding force between the first redistribution layer 110 and the encapsulant 150 may be further increased. The configuration of the semiconductor device 300 may result from a difference in the manufacturing methods described herein.

Figure 4:
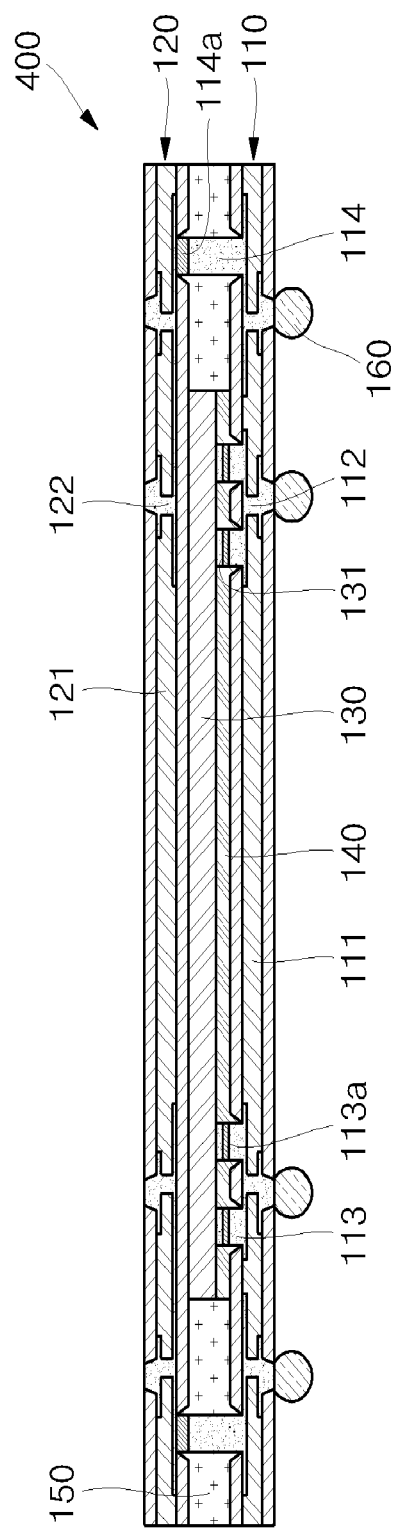
FIG. 4 is a cross-sectional view illustrating a semiconductor device with single pillars for connecting redistribution layers, in accordance with an example embodiment of the present disclosure.

FIG. 4 is a cross-sectional view illustrating a semiconductor device with single pillars for connecting redistribution layers, in accordance with an example embodiment of the present disclosure.

As illustrated in FIG. 4, in the semiconductor device 400 according to another embodiment of the present disclosure, a semiconductor die 130 may be brought into direct contact with the second redistribution layer 120. For example, since a top surface of the semiconductor die 130 may make direct contact with a bottom surface of the second redistribution layer 120, there might be no encapsulant existing between the top surface of the semiconductor die 130 and the bottom surface of the second redistribution layer 120.

Accordingly, a distance between the first redistribution layer 110 and the second redistribution layer 120 may be reduced. Thus, a conductive pillar 114 might be formed only on the first redistribution layer 110 or the second redistribution layer 120. For example, the first redistribution layer 110 and the second redistribution layer 120 may be electrically connected to each other through the single conductive pillar 114. A solder cap 114a may be formed at an end of the conductive pillar 114.

As described above, there might be no encapsulant existing in a space or gap between the semiconductor die 130 and the second redistribution layer 120, thereby enabling the semiconductor device 400 to have a further reduced thickness.

Figure 5:
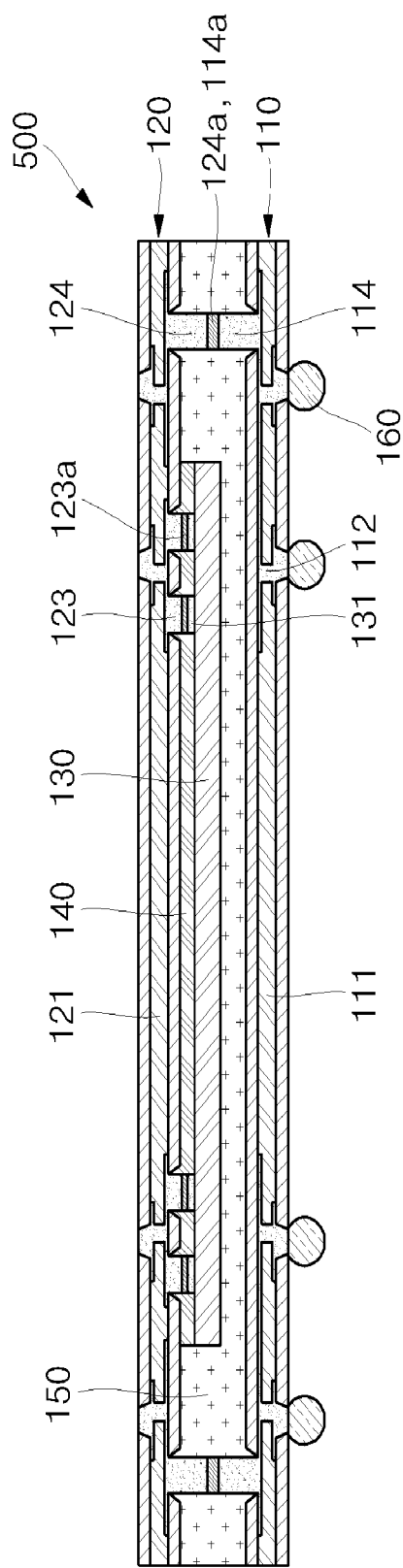
FIG. 5 is a cross-sectional view illustrating a semiconductor device with a flip-chip bonded die, in accordance with an example embodiment of the present disclosure.

FIG. 5 is a cross-sectional view illustrating a semiconductor device with a flip-chip bonded die, in accordance with an example embodiment of the present disclosure.

As illustrated in FIG. 5, in the semiconductor device 500 according to another embodiment of the present disclosure, a semiconductor die 130 may be electrically connected to a second redistribution layer 120, instead of a first redistribution layer 110. For example, the semiconductor die 130 may be electrically connected to the second redistribution layer 120 in a flip-chip type configuration. Here, an underfill 140 may be injected into a space between the semiconductor die 130 and the second redistribution layer 120, thereby further increasing a mechanical binding force between the semiconductor die 130 and the second redistribution layer 120. In addition, a conductive pad 123 to be connected to a bump 131 of the semiconductor die 130 may be formed in the second redistribution layer 120, and a solder cap 123a may be formed between the conductive pad 123 and the bump 131.

Figure 6:
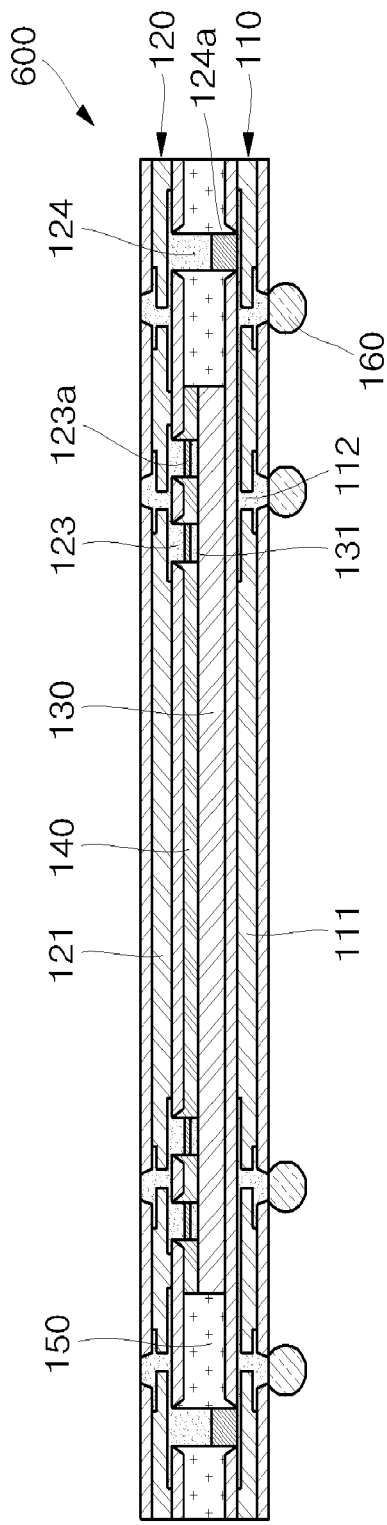
FIG. 6 is a cross-sectional view illustrating a semiconductor device with a semiconductor die in contact with a first redistribution layer and electrically coupled to a second redistribution layer, in accordance with another example embodiment of the present disclosure.

FIG. 6 is a cross-sectional view illustrating a semiconductor device with a semiconductor die in contact with a first redistribution layer and electrically coupled to a second redistribution layer, in accordance with an another example embodiment of the present disclosure.

As illustrated in FIG. 6, in the semiconductor device 600 according to another embodiment of the present disclosure, a semiconductor die 130 may be brought into direct contact with the first redistribution layer 110. For example, since a bottom surface of the semiconductor die 130 makes direct contact with a top surface of the first redistribution layer 110 in this example, there might be no encapsulant existing between the bottom surface of the semiconductor die 130 and the top surface of the first redistribution layer 110.

In addition, a distance between the first redistribution layer 110 and the second redistribution layer 120 may be reduced. Thus, a conductive pillar 124 might be formed only on the first redistribution layer 110 or the second redistribution layer 120. For example, the first redistribution layer 110 and the second redistribution layer 120 may be electrically connected to each other through the single conductive pillar 124. A solder cap 124a may be formed at an end of the conductive pillar 124.

As described above, there might be no encapsulant existing in a space or gap between the semiconductor die 130 and the first redistribution layer 110, thereby enabling the semiconductor device 600 to have a further reduced thickness.

Figures 7A, 7B, 7C:
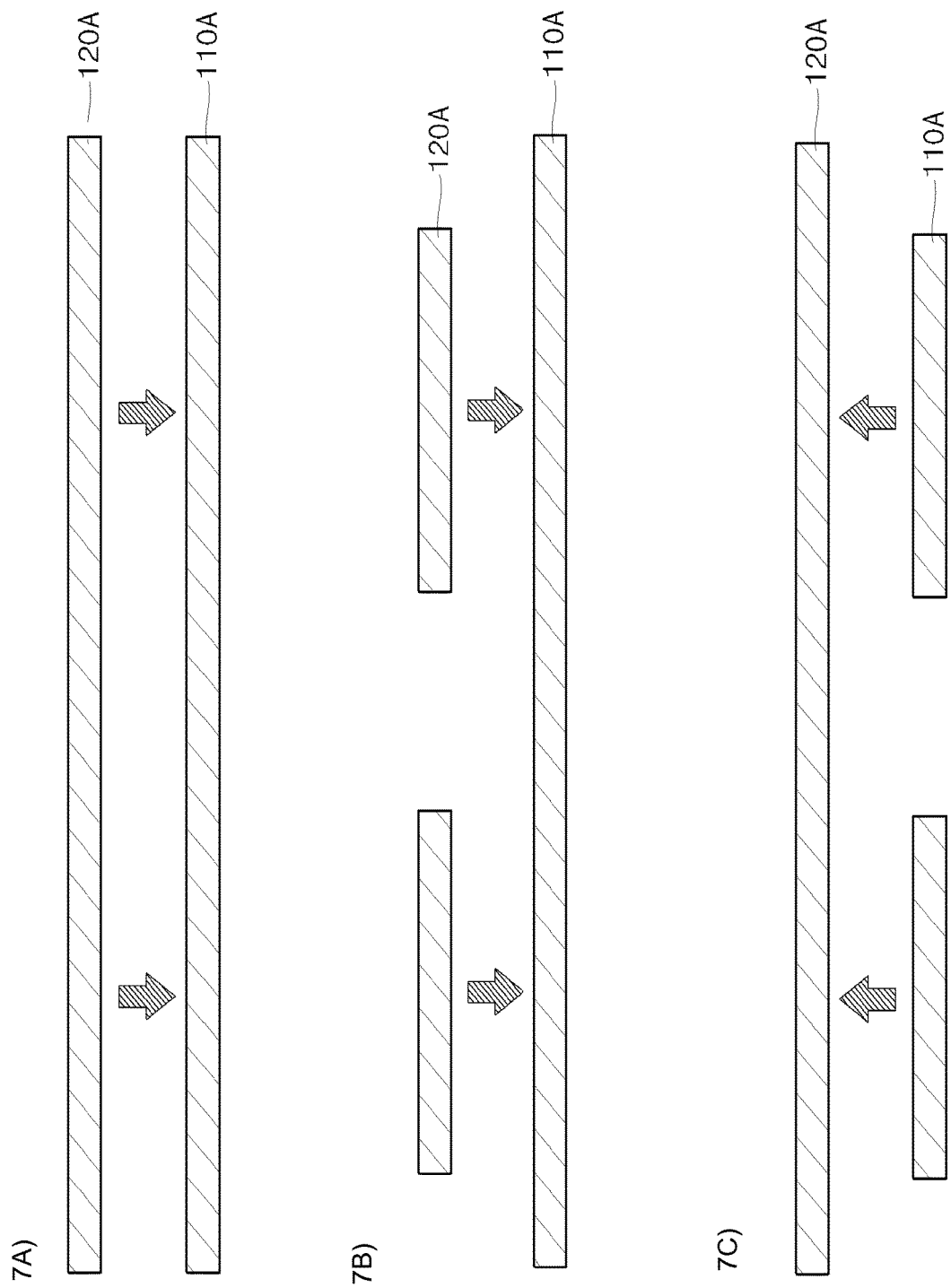
FIGS. 7A-7C are diagrams illustrating a manufacturing method of a semiconductor device utilizing different sizes of dummy substrates, in accordance with an example embodiment of the present disclosure.

FIGS. 7a-7c are diagrams illustrating a manufacturing method of a semiconductor device utilizing different sizes of dummy substrates, in accordance with an example an embodiment of the present disclosure.

As illustrated in FIG. 7A, first and second dummy substrates 110A and 110B may be provided in forms of panels. For example, the lengths of the first and second dummy substrates 110A and 110B may be equal to each other, and a plurality of semiconductor devices 100 may be manufactured between the first and second dummy substrates 110A and 110B. The semiconductor device 100 shown in FIG. 1N may be manufactured by the panel-shaped first and second dummy substrates 110A and 110B, followed by sawing, thereby making the first and second redistribution layers 110 and 120 and side surfaces of the encapsulant 150 coplanar.

Here, the panel has a substantially rectangular shape and may be provided in a strip from which a plurality of semiconductor devices may be manufactured.

As illustrated in FIG. 7B, a first dummy substrate 110A may be provided in the form of a panel and second dummy substrates 120A may also be provided. For example, the second dummy substrates 120A in forms of multiple units each having a relatively small length may be positioned on the first dummy substrate 110A in the form of a panel having a relatively large length. Therefore, the plurality of semiconductor devices 200 may be manufactured between the panel-type first dummy substrate 110A and the unit-type second dummy substrates 120A. The semiconductor device 200 shown in FIG. 2 may, for example, be manufactured by the panel-type first dummy substrate 110A and the unit-type second dummy substrates 120A, followed by sawing, thereby allowing the encapsulant 150 to cover side surfaces of the second redistribution layer 120. Here, side surfaces of the encapsulant 150 and the first redistribution layer 110 may be coplanar.

As illustrated in FIG. 7C, the second dummy substrates 120A may be provided in forms of panels and the first dummy substrate 110A may be provided in form of a unit. For example, multiple first dummy substrates 110A in forms of multiple units each having a relatively small length may be positioned under a panel-type second dummy substrate 120A in the form of a panel having a relatively large length. Therefore, a plurality of semiconductor devices 300 may be formed between the panel-type second dummy substrate 120A and the unit-type first dummy substrates 110A. The semiconductor devices 300 shown in FIG. 3 may, for example, be manufactured by the panel-type second dummy substrate 120A and the unit-type first dummy substrates 110A, followed by sawing, thereby allowing the encapsulant 150 to cover side surfaces of the first redistribution layer 110. Here, side surfaces of the encapsulant 150 and the second redistribution layer 120 may be coplanar.

Although not shown, the first and second dummy substrates 110A and 110B may also be provided in forms of units. Semiconductor devices may be manufactured between the unit-type first and second dummy substrates 110A and 110B, followed by sawing, thereby allowing the encapsulant 150 to surround side surfaces of the first and second redistribution layers 110 and 120.

Figure 8:
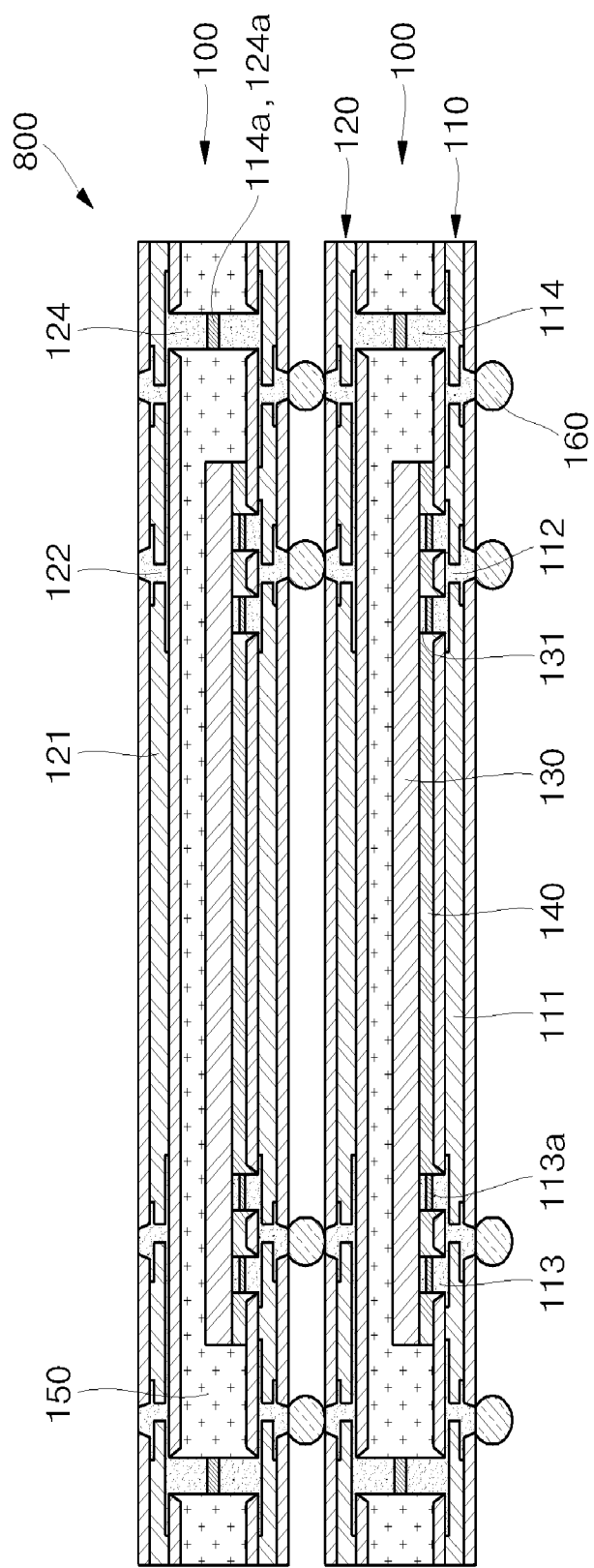
FIG. 8 is a cross-sectional view illustrating stacked semiconductor devices, in accordance with an example embodiment of the present disclosure.

FIG. 8 is a cross-sectional view illustrating stacked semiconductor devices, in accordance with an example embodiment of the present disclosure.

As illustrated in FIG. 8, according to the embodiment of the present disclosure, a plurality of semiconductor devices 100 may be prepared, and the plurality of semiconductor devices 100 may be vertically stacked to attain a single POP semiconductor device 800.

In an exemplary embodiment, an overlying second semiconductor device 100 may be electrically connected to an underlying first semiconductor device 100. In detail, a solder ball 160 of the second semiconductor device 100 may be electrically connected to a second redistribution layer 120 of the first semiconductor device 100.

In such a manner, according to the present disclosure, the plurality of semiconductor devices 100 may be easily stacked, thereby providing the POP semiconductor device 800, which may be applied to a highly functional smart phone, mobile phone or computer.

Figure 9:
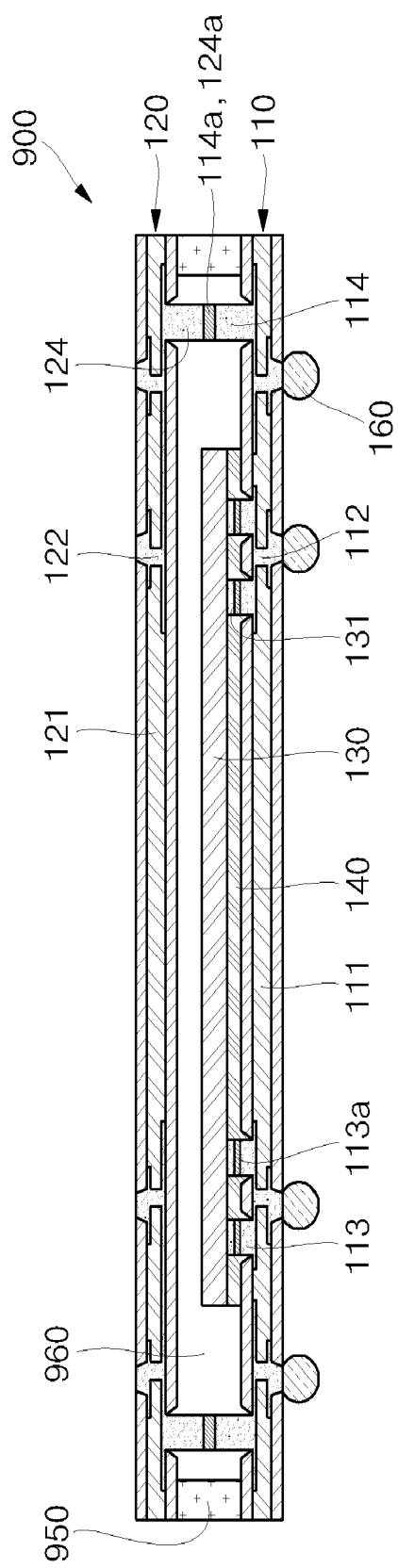
FIG. 9 is a cross-sectional view illustrating a semiconductor device with a formed cavity, in accordance with an example embodiment of the present disclosure.

FIG. 9 is a cross-sectional view illustrating a semiconductor device (900) with a formed cavity, in accordance with an example embodiment of the present disclosure.

As illustrated in FIG. 9, in the semiconductor device 900 according to another embodiment of the present disclosure, an encapsulant 950 may be formed only between a first redistribution layer 110 and a second redistribution layer 120, which are at exterior areas of conductive pillars 114 and 124. For example, the encapsulant 950 may be formed only at the exterior areas without surrounding the semiconductor die 130 and conductive pillars 114 and 124, thereby allowing the semiconductor die 130 and conductive pillars 114 and 124 to be positioned in an empty space 960 between the first redistribution layer 110 and the second redistribution layer 120. The space 960 may be filled with nitrogen or inert gas (Argon) to suppress the semiconductor die 130 and the conductive pillars 114 and 124 from being oxidized. Further, in some cases, the encapsulant 950 might not be provided or a throughhole (not shown) may be formed in the encapsulant 950, so that externally applied physical variations, such as sonic waves, pressure, etc., may be transmitted to the semiconductor die 130.

In such a manner, the semiconductor device 900 according to the embodiment of the present disclosure may accommodate the semiconductor die 130 or semiconductor packages, such as MEMS (micro-electromechanical systems), allowing the semiconductor device 900 to be applied in a wider variety of application fields.

Figure 10A:
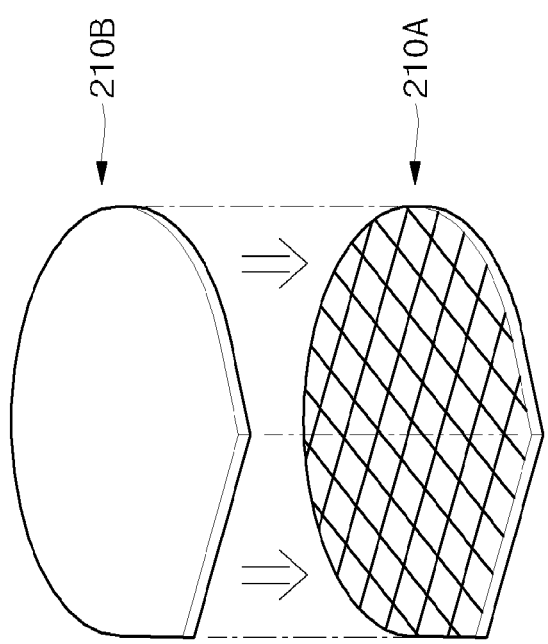
FIGS. 10A-10C are diagrams illustrating a manufacturing method of a semiconductor device utilizing panels and individual units, in accordance with an example embodiment of the present disclosure.
Figures 10B, 10C:
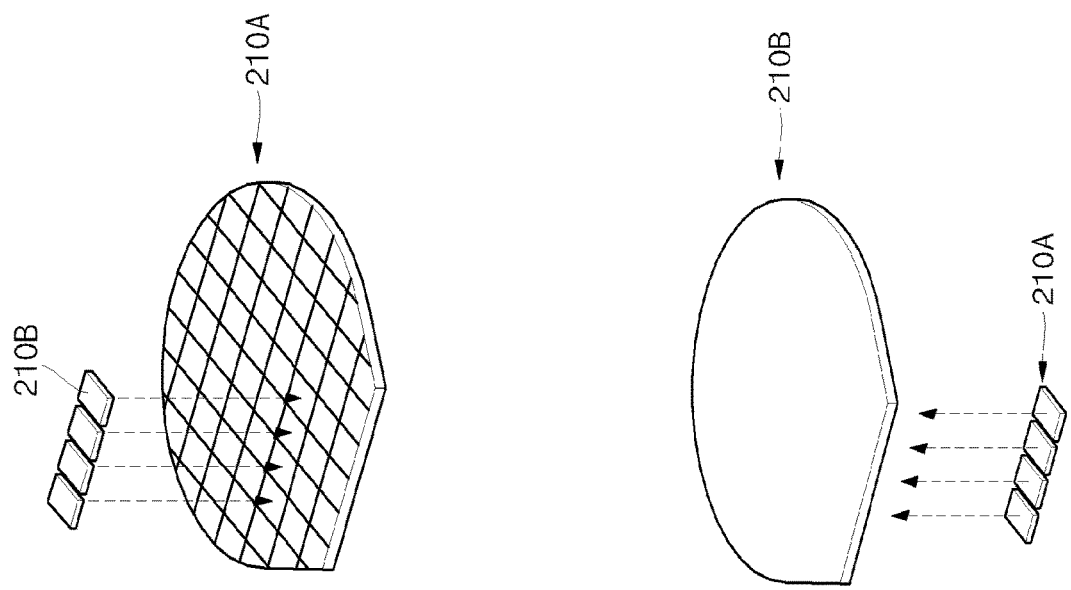

FIGS. 10A-10C are diagrams illustrating a manufacturing method of a semiconductor device utilizing panels and individual units, in accordance with an example embodiment of the present disclosure.

As illustrated in FIG. 10A, first and second dummy substrates 210A and 210B may be provided in forms of substantially round wafers. For example, round areas of the first and second dummy substrates 210A and 210B may be equal to each other, and a plurality of semiconductor devices 100 may be manufactured between the first and second dummy substrates 210A and 210B. The semiconductor device 100 shown in FIG. 1N may be manufactured by the wafer-type first and second dummy substrates 210A and 210B, followed by sawing, thereby making side surfaces of the first and second redistribution layers 110 and 120 and the encapsulant 150 coplanar.

As illustrated in FIG. 10B, the first dummy substrate 210A may be provided in the form of a wafer and the second dummy substrates 210B may be provided in the form of units. The second dummy substrates 210B in forms of multiple units each having a relatively small area may be positioned on the first dummy substrate 210A in the form of a wafer having a relatively large area. Therefore, the plurality of semiconductor devices 200 may be manufactured between the wafer-type first dummy substrate 210A and the unit-type second dummy substrates 210B. The semiconductor device 200 shown in FIG. 2 may be manufactured by the wafer-type first dummy substrate 210A and the unit-type second dummy substrates 210B, followed by sawing, thereby allowing the encapsulant 150 to cover side surfaces of the second redistribution layer 120. Here, side surfaces of the encapsulant 150 and the first redistribution layer 110 may be coplanar.

As illustrated in FIG. 10C, the second dummy substrate 210B may be provided in form of a wafer and the first dummy substrates 210A may be provided in form of units. The first dummy substrates 210A in forms of multiple units each having a relatively small area may be positioned under the second dummy substrate 210B in the form of a wafer having a relatively large area. Therefore, a plurality of semiconductor devices 300 may be manufactured between the wafer-type second dummy substrate 210B and the unit-type first dummy substrates 210A. The semiconductor devices 300 shown in FIG. 3 may be manufactured by the wafer-type second dummy substrate 2108 and the unit-type first dummy substrates 210A, followed by sawing, thereby allowing the encapsulant 150 to surround side surfaces of the first redistribution layer 110. Here, side surfaces of the encapsulant 150 and the second redistribution layer 120 may be coplanar.

This disclosure provides example embodiments supporting the present disclosure. The scope of the present disclosure is not limited by these example embodiments. Numerous variations, whether explicitly provided for by the specification or implied by the specification, such as variations in structure, dimension, type of material and manufacturing process, may be implemented by one skilled in the art in view of this disclosure.

In an example embodiment of the disclosure a semiconductor device with plated pillars and leads is disclosed and may comprise forming a first redistribution layer on a first dummy substrate, forming a second redistribution layer on a second dummy substrate, electrically connecting a semiconductor die to the first redistribution layer, electrically connecting the first redistribution layer to the second redistribution layer, and removing the first and second dummy substrates. The first redistribution layer may be electrically connected to the second redistribution layer utilizing a conductive pillar.

An encapsulant material may be formed between the first redistribution layer and the second redistribution layer. Side portions of one of the first and second redistribution layers may be covered with encapsulant. A surface of the semiconductor die may be in contact with the second redistribution layer. The first and second dummy substrates may be in panel form or one of the first and second dummy substrates may be in panel form and the other may be in unit form. A third redistribution layer may be bonded to one of the first and second redistribution layers after removing the first and second dummy substrates.

An encapsulant material may be formed near side edges of the first and second redistribution layers but not in contact with the semiconductor die. A back surface of the first and second redistribution layers may be exposed by removing the first and second dummy substrates. A solder ball may be formed on an exposed back surface of the first and second redistribution layers. The first and second dummy substrates may be removed utilizing grinding and/or etching processes. The semiconductor die may be flip-chip bonded to the first redistribution layer.

While various aspects of the present disclosure have been described with reference to certain supporting embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A semiconductor package, comprising:
   a first coreless multi-layered redistribution structure;
   a second coreless multi-layered redistribution structure;
   a first conductive pillar comprising a proximal end electrically and mechanically coupled to a top surface of the first coreless multi-layered redistribution structure;
   a second conductive pillar comprising a proximal end electrically and mechanically coupled to a bottom surface of the second coreless multi-layered redistribution structure, and a distal end electrically and mechanically coupled to a distal end of the first conductive pillar;
   a semiconductor die comprising a bottom surface electrically coupled to the top surface of the first coreless multi-layered redistribution structure and positioned between the top surface of the first coreless multi-layered redistribution structure and the bottom surface of the second coreless multi-layered redistribution structure;

an encapsulating material contacting the top surface of the first coreless multi-layered redistribution structure and the bottom surface of the second coreless multi-layered redistribution structure; and an underfill, different from the encapsulating material, contacting the bottom surface of the semiconductor die and the top surface of the first coreless multi-layered redistribution structure.

2. The semiconductor package according to claim 1, comprising package interconnection structures coupled to the first coreless multi-layered redistribution structure at a side of the first coreless multi-layered redistribution structure opposite the semiconductor die.

3. The semiconductor package according to claim 1, wherein the first conductive pillar extends from the first coreless multi-layered redistribution structure at least as far as a height of the semiconductor die from the first coreless multi-layered redistribution structure.

4. The semiconductor package according to claim 3, wherein the first conductive pillar has a width of approximately 50 mm.

5. The semiconductor package according to claim 1, wherein the semiconductor die is electrically coupled to the first coreless multi-layered redistribution structure utilizing a conductive bump with a solder cap.

6. The semiconductor package according to claim 1, wherein a thickness of the first coreless multi-layered redistribution structure is in a range of 20 nm to 1000 nm.

7. The semiconductor package according to claim 1, wherein the semiconductor die is in direct contact with the second coreless multi-layered redistribution structure.

8. The semiconductor package according to claim 1, comprising a solder ball on a second surface of the first coreless multi-layered redistribution structure, where the second surface is opposite a first surface of the first coreless multi-layered redistribution structure to which the semiconductor die is coupled.

9. A semiconductor package, comprising:
a first coreless multi-layered redistribution structure comprising a first top surface, a first bottom surface opposite the first top surface, and a first side surface adjacent the first top surface and the first bottom surface;
a second coreless multi-layered redistribution structure comprising a second top surface, a second bottom surface opposite the second top surface, and a second side surface adjacent the second top surface and the second bottom surface, wherein the second coreless multi-layered redistribution structure is electrically coupled to the first coreless multi-layered structure;
a semiconductor die connected to the first coreless multi-layered structure and positioned between the first and second coreless multi-layered redistribution structures;
a conductive pillar of a single continuous material attached to the first coreless multi-layered redistribution structure and electrically and mechanically coupled to the second coreless multi-layered redistribution structure, wherein the conductive pillar extends from the first coreless multi-layered redistribution structure at least as far as a height of the semiconductor die from the first coreless multi-layered redistribution structure; and
an encapsulant between the first and second coreless multi-layered redistribution structure, wherein the encapsulant contacts at least a portion of the semiconductor die, at least a portion of the conductive pillar, at least a portion of the first top surface of the first coreless multi-layered redistribution structure, at least a portion of the second bottom surface of the second coreless multi-layered redistribution structure, and at least one side surface selected from the first side surface of the first coreless multi-layered redistribution structure and the second side surface of the second coreless multi-layered redistribution structure.

10. The semiconductor package according to claim 9, wherein the conductive pillar spans an entire thickness of the semiconductor die.

11. The semiconductor package according to claim 9, wherein the conductive pillar is a copper pillar.

12. The semiconductor package according to claim 9, wherein the semiconductor die is in direct contact with the second coreless multi-layered redistribution structure.

13. The semiconductor package according to claim 9, wherein a top surface of the encapsulant is coplanar with the second top surface.

14. The semiconductor package according to claim 1, wherein:
the distal end of the first conductive pillar and the distal end of the second conductive pillar form an electrical connection; and
the encapsulating material contacts and surrounds the electrical connection.

15. The semiconductor package according to claim 1, wherein the first conductive pillar and the second conductive pillar comprises a same conductive material.

16. The semiconductor package according to claim 1, wherein:
the semiconductor die further comprises a top surface opposite the bottom surface of the semiconductor die; and
the distal end of the second conductive pillar extends past the top surface of the semiconductor die.

* * * * *